United States Patent
Serra et al.

(10) Patent No.: US 11,635,115 B2
(45) Date of Patent: *Apr. 25, 2023

(54) BRAKE PAD WITH THERMOELECTRIC ENERGY HARVESTER

(71) Applicant: ITT Italia S.r.l., Barge (IT)

(72) Inventors: Stefano Serra, San Pietro Val Lemina (IT); Paolo Truccone, Barge (IT); Umberto Vignolo, Barge (IT); Ali Asghar Enkeshafi, Barge (IT); Lasse Aistrup Rosendahl, Barge (IT); Paw Vestergard Mortensen, Barge (IT); Agustin Sin Xicola, Barge (IT)

(73) Assignee: ITT Italia S.R.L., Berge (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/321,221

(22) Filed: May 14, 2021

(65) Prior Publication Data

US 2022/0003283 A1     Jan. 6, 2022

Related U.S. Application Data

(63) Continuation of application No. 16/128,333, filed on Sep. 11, 2018, now Pat. No. 11,035,425.
(Continued)

(30) Foreign Application Priority Data

Sep. 12, 2017   (IT) .................... 102017000102064

(51) Int. Cl.
*F16D 61/00*     (2006.01)
*F16D 65/84*     (2006.01)
(Continued)

(52) U.S. Cl.
CPC ........... *F16D 61/00* (2013.01); *F16D 65/092* (2013.01); *F16D 65/84* (2013.01); *F16D 67/06* (2013.01);
(Continued)

(58) Field of Classification Search
CPC ........ F16D 61/00; F16D 65/84; F16D 65/092; F16D 2250/0084; H01L 35/34; H01L 35/30
See application file for complete search history.

(56) References Cited

U.S. PATENT DOCUMENTS 3,674,114 A * 7/1972 Howard ................ F16D 66/00
                                                188/1.11 R
4,606,434 A * 8/1986 Vasilow ................ F16D 66/022
                                                200/61.4
(Continued)

FOREIGN PATENT DOCUMENTS

CN          106246772 A     12/2016
EP             2622239 B1   11/2014
(Continued)

OTHER PUBLICATIONS

Italian search Report and Written Opinion for IT Application No. IT201700102064, dated May 2, 2018 in 6 pages.
(Continued)

*Primary Examiner* — Vishal R Sahni
(74) *Attorney, Agent, or Firm* — Knobbe, Martens, Olson & Bear, LLP

(57) ABSTRACT

Various brake pads with thermoelectric energy harvesters are disclosed. In some embodiments, the brake pad comprising a backplate, a pad of friction material, and a TEG module. The backplate can comprise a through-hole in which elements of the TEG module are positioned.

20 Claims, 8 Drawing Sheets

Related U.S. Application Data

(60) Provisional application No. 62/628,690, filed on Feb. 9, 2018.

(51) Int. Cl.
*H01L 35/30* (2006.01)
*H01L 35/34* (2006.01)
*F16D 65/092* (2006.01)
*F16D 67/06* (2006.01)

(52) U.S. Cl.
CPC .............. *H01L 35/30* (2013.01); *H01L 35/34* (2013.01); *F16D 2250/0084* (2013.01)

(56) References Cited

U.S. PATENT DOCUMENTS

| | | | | |
|---|---|---|---|---|
| 5,015,990 | A * | 5/1991 | Reede | F16D 66/024 |
| | | | | 188/DIG. 1 |
| 5,561,895 | A * | 10/1996 | Clark | B21J 15/32 |
| | | | | 188/73.1 |
| 6,193,020 | B1 * | 2/2001 | Takanashi | F16D 66/024 |
| | | | | 188/1.11 L |
| 7,011,185 | B2 * | 3/2006 | Kramer | F16D 66/024 |
| | | | | 188/1.11 E |
| 8,770,352 | B2 * | 7/2014 | Horio | B60T 17/221 |
| | | | | 188/71.6 |
| 9,939,035 | B2 | 4/2018 | Donzelli et al. | |
| 9,964,167 | B2 | 5/2018 | Martinotto et al. | |
| 10,107,343 | B2 * | 10/2018 | Robert | H01L 35/32 |
| 10,227,064 | B2 | 3/2019 | Serra et al. | |
| 10,295,006 | B2 | 5/2019 | Serra et al. | |
| 10,451,130 | B2 | 10/2019 | Solari et al. | |
| 10,495,168 | B2 | 12/2019 | Serra et al. | |
| 11,035,425 | B2 | 6/2021 | Serra et al. | |
| 2012/0000737 | A1 * | 1/2012 | Horio | F16D 61/00 |
| | | | | 188/71.6 |
| 2016/0215833 | A1 * | 7/2016 | Robert | F16D 55/225 |
| 2017/0201120 | A1 | 7/2017 | Lisini | |
| 2019/0005743 | A1 | 1/2019 | Serra et al. | |
| 2019/0078630 | A1 * | 3/2019 | Serra | F16D 61/00 |

FOREIGN PATENT DOCUMENTS

| | | |
|---|---|---|
| JP | S58-037329 A | 3/1983 |
| JP | H11-220804 A | 8/1999 |
| WO | WO 2010/109592 A1 | 9/2012 |

OTHER PUBLICATIONS

International Search Report for PCT/EP2018/073821, dated Nov. 27, 2018, in 3 pages.
Written Opinion for PCT/EP2018/073821, dated Nov. 27, 2018, in 5 pages.

* cited by examiner

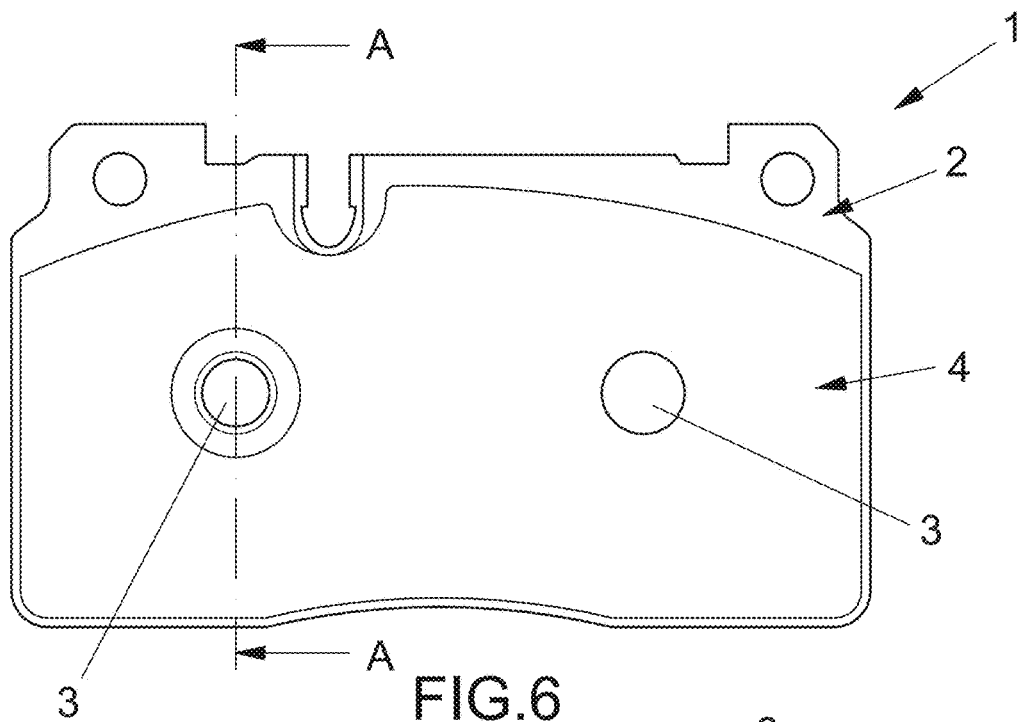
FIG.6
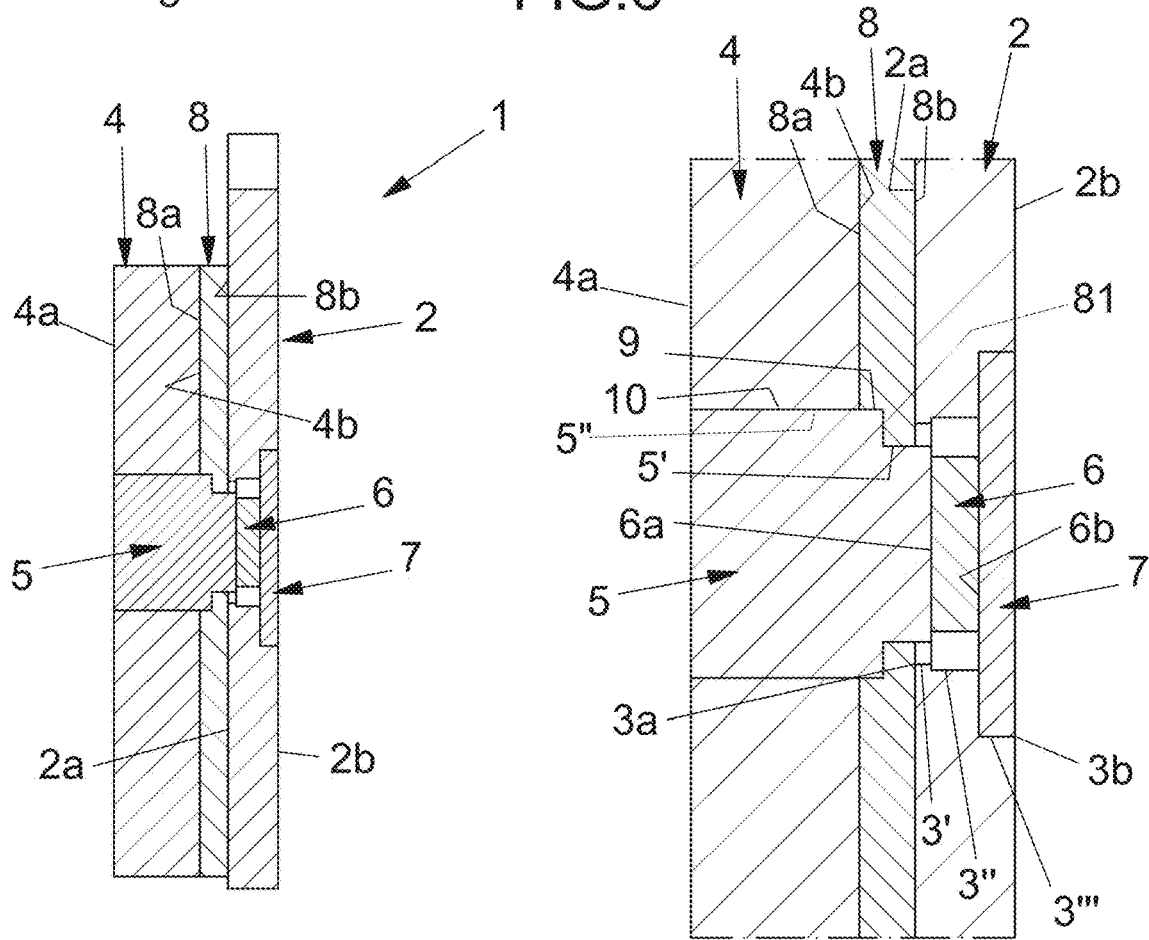
FIG.7
FIG.8

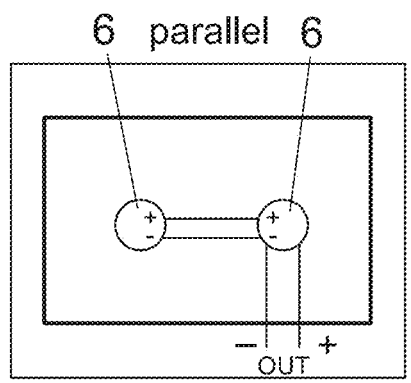
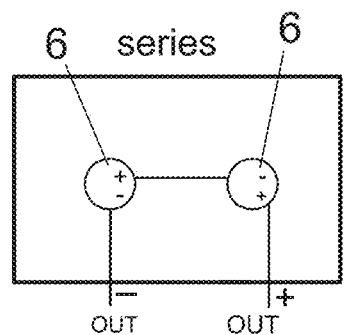
FIG.12a    FIG.12b
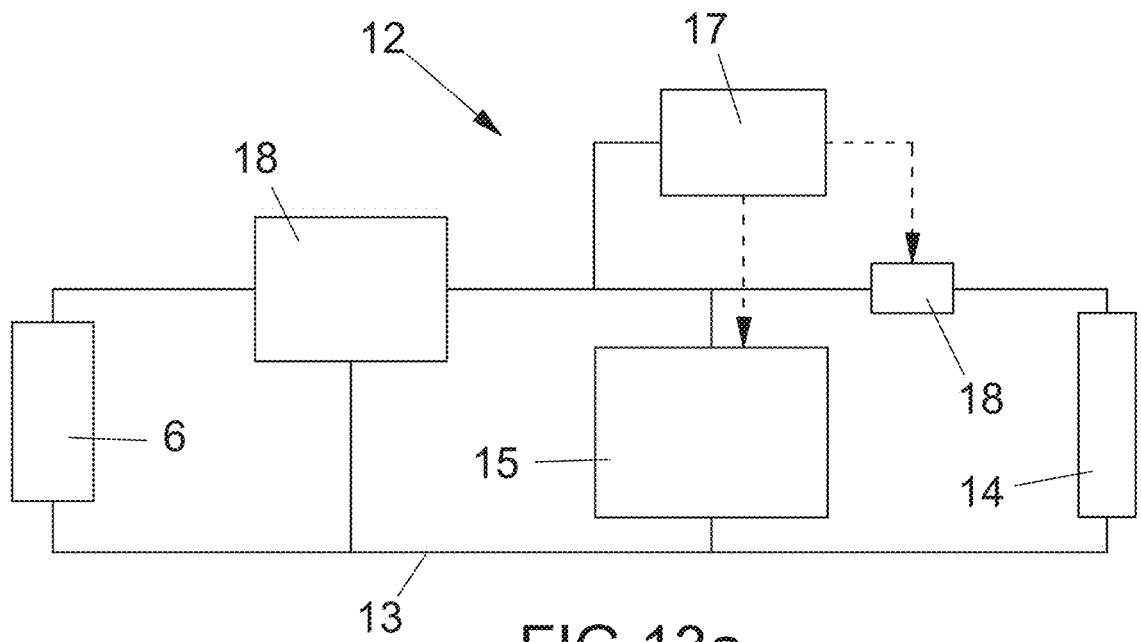
FIG.13a
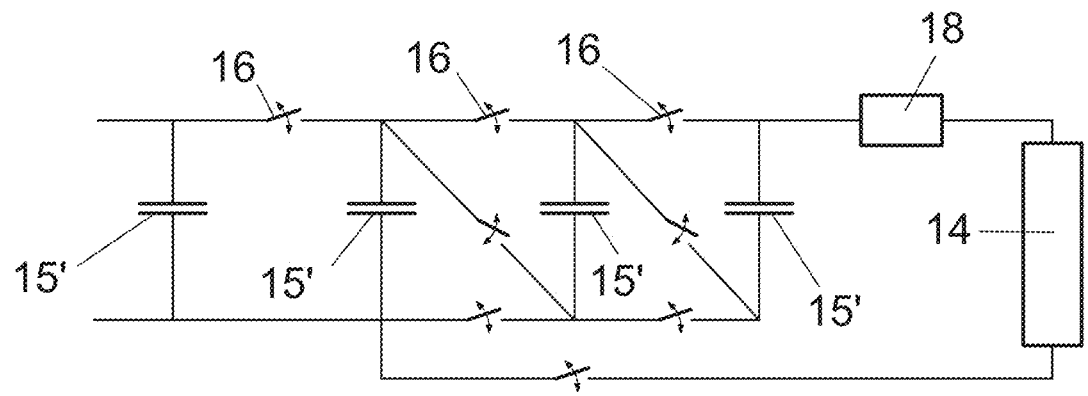
FIG.13b

BRAKE PAD WITH THERMOELECTRIC ENERGY HARVESTER

CROSS REFERENCE

Any and all applications for which a foreign or domestic priority claim is identified in the Application Data Sheet as filed with the present application are hereby incorporated by reference under 37 CFR 1.57.

BACKGROUND

Field

The present disclosure relates to a brake pad with a thermoelectric energy harvester designed and constructed for use in rotary or linear braking systems such as, but not limited to those found in vehicles, windmills, railways, and electromotors, etc.

Related Art

The thermoelectric (Seebeck) effect refers to the conversion of a temperature difference between two sides of a thermoelectric material into an electric voltage. In reverse, the thermoelectric effect can create a temperature difference by applying an electric voltage to the thermoelectric material.

The thermoelectric effect can be observed in many different materials, such as semiconductor materials. A thermoelectric device can be made of two semiconductor materials, one n-doped and the other p-doped. Charge carriers diffusing between the hot n-doped side to a cold p-doped side of the semiconductor material (or vice versa) can create a voltage potential difference across the thermoelectric device. The electric voltage potential is proportional to the difference in temperature between the two sides.

The two semiconductor materials can be coupled to different thermal sources (one cold and a second warm), creating an ongoing voltage difference due to the thermoelectric effect. This voltage difference can be harnessed by an electrical connection between the two sides. A load across the electrical connection between the two semiconductor materials creates a complete circuit through which a current can flow. In this manner the thermoelectric device behaves like an electric generator powered by the temperature differences.

SUMMARY

Thermoelectric devices can be used in several fields of application, including braking systems. In a friction braking system, large amounts of thermal energy are produced. At least a portion of this thermal energy can be recovered using the thermoelectric effect in the form of electrical energy. For example, a vehicle of a mass of 1500 kg braked to stop from an initial speed of 100 km/h using brake pads dissipates about 1 MJ through frictional forces. This results in a significant increase to the internal temperature of the brake pads. Assuming that only a very small portion of such energy (5%) is converted into electrical energy, the total amount of the recovered energy (approximately 50 kJ in the above example) can still be large enough to put to meaningful application. Thus, R&D activities around the world have been focused on recovering thermal energy from friction brakes.

Some implementations comprise p and n-doped TEG elements interconnected in series and forming an array located in a specific structure on the back of the pad and having an electrically insulating layer on the backplate to avoid short circuiting. This solution, while not invasive of the brake pad, is hardly usable in real applications. It requires a substantial redesign of a caliper or a pad to account for the remarkable change in thickness of the TEG-modified pad. Another drawback of this design comes from the small temperature difference expected across the two sides of the structure. Because the TEG is located on the opposite side of the friction material (the warm side of the pad) there is only a small temperature gradient and, the result is a solution with poor thermal efficiency.

Some implementations comprise a system integrated on a caliper. A heat pipe connected to the caliper touches the TEG external to the caliper. The brake, generally speaking, is on the other side in contact with a radiator to provide the cold side of the element. One drawback of this approach is related to the choice of the caliper as a warm side source, since, relative to the other components of a brake systems (rotor, pad and caliper), the caliper is colder with a smaller maximum temperature achieved. This results in an inefficient solution.

Some implementations integrate multiple TEG elements integrated in a brake pad. The TEG elements are on the backplate on the side of the friction element or within a recess of the backplate on the friction material side. A cylindrical structure made of friction material and filled with carbon nanotube material is used as a heat exchanger in contact with the TEG units. One drawback of such solutions is that there is a limited thermal conductivity of the steel composing the backplate materials with respect to other metals. Also, the thermal gradient is limited to being between the friction material surface and the backplate on the friction material side. Moreover there are still issues related to the manufacturability and reliability of such components; the TEG modules integrated on the surface of the backplate of the pad and henceforth are exposed to the intense pressure and forces on the pad during the manufacturing process and during the operation of the brake pad, where pressure can reach up to 400 bar and over. Also, in the configuration with a recessed backplate, the NVH properties of the brake pad can be altered. For example, recessed backplate can cause issues with the friction material's adhesion to the backplate.

Some implementations comprise a TEG brake pad, comprising a TEG elements array and a plurality of thermal connection elements in contact with the rotor from one side and with the TEG elements on the other side. The TEG array having means to produce electricity during braking and transferring heat from the rotor to the brake body. These reliability and manufacturability issues are not addressed in this patent. For instance, the pressure of the rotor on the pad during braking will be propagated directly down to the TEG elements in a damaging manner.

Considerations for an effective energy harvesting system can include, for example, increasing and/or maximization of the thermal gradient between cold and warm sides of the thermoelectric generator and increasing and/or maximization of the efficiency of the thermoelectric generator (TEG). Moreover, a TEG designed for integration into a brake pad should have a minimal impact on the overall brake pad design and performance and must be of a robust and reliable design.

As explained above, the impact of integrating a TEG module on a brake pad is often underestimated. Indeed, substantial changes in the structure of the brake pad or in the backplate of the brake pad to integrate the TEG trigger changes in the NVH behavior (Noise, Vibration and Harshness) and in the performances of the brake pad. An integration approach that installs the TEG invasively within the backplate surface or the friction material may induce complications with the friction material attachment to the backplate. This is one of the difficulties blocking real application of the technology.

In various embodiments, the present disclosure provides a brake pad with an integrated thermoelectric energy harvester for a braking system. In some implementations, this brake pad can overcome the limitations suffered by other thermoelectric applications in brakes.

In some embodiments, the present disclosure provides a brake pad with an integrated thermoelectric energy harvester for any braking system having an improved temperature gradient across the TEG module.

In some embodiments, the present disclosure provides a brake pad with a TEG module for a braking system that has a reduced impact on the braking device. In some implementations of the TEG module integration, issues related to changes on the NVH behavior due to modification, such as changes in the braking device performances or the detachment of the brake pad components, can be eliminated or reduced.

In some embodiments, the present disclosure provides a brake pad with a TEG module for any braking system having improved long term reliability and pressure load resistance.

In some implementations, the present disclosure comprises a brake pad having a backplate, a friction pad made of a friction material, and a TEG module comprising p and n-doped semiconductor elements. The backplate is provided with a through-hole therein. The p and n-doped semiconductor elements of the TEG module are integrated at least partially within the through-hole.

In some embodiments of the disclosure, the TEG module is entirely integrated in the hole.

In some implementations, a first and a second heat exchanger are positioned in contact to opposite outer surfaces of the TEG module.

In some implementations, the through-hole has a first end opening on an internal surface of the backplate and a second end opening on an external surface of the backplate.

In some implementations, the through-hole is a spigot-hole of the type present on a typical brake pad backplate. The brake pad backplate can be further suitably processed to integrate the TEG module within the spigot-hole.

In some implementations of the disclosure, the TEG module is in form of a plate having a first surface facing the internal surface of the backplate and a second surface facing the external surface of the backplate.

In some implementations of the disclosure, the first surface is flat and generally parallel to the internal surface of the backplate and the second surface is flat and generally parallel to the external surface of the backplate.

In some implementations of the disclosure, the first and second surfaces of the TEG module are located inside the through-hole.

In some implementations of the disclosure, the first heat exchanger is positioned in contact on the first surface of the TEG module and the second heat exchanger is positioned in contact on the second surface of the TEG module.

In some implementations of the disclosure, the first heat exchanger extends within a channel of the friction pad.

In some implementations of the disclosure, the first heat exchanger is fixed to a wall of the channel within the friction material of the friction pad by a mechanical means (e.g., threaded) or adhesively.

In some implementations of the disclosure, the first heat exchanger is substantially flush with an external surface of the friction pad.

In some implementations of the disclosure, the first heat exchanger extends in a channel of an underlayer interposed between the friction pad and the backplate.

In some implementations of the disclosure, the second heat exchanger is substantially flush with the external surface of the backplate.

In some implementations of the disclosure, at least one of the first and second heat exchanges is made of graphite.

In some implementations of the disclosure, the through-hole comprises a first end section (including the first end of the through-hole) having a first diameter, an intermediate section having a second diameter larger than the first diameter, and a second end section (including the second end of the through-hole) having a third diameter larger than the second diameter.

In some implementations of the disclosure, the first and second heat exchangers have cylindrical shapes.

In some implementations of the disclosure, the first heat exchanger is disposed within the first end section of the through-hole and/or the second heat exchanger is disposed within the second end section of the through-hole.

In some implementations of the disclosure, the first heat exchanger has a narrowed end portion or lip engaging the backplate within the first end section of the through-hole. In this configuration, the narrowed end portion or lip reduce the pressure applied against the TEG module from pressure on the brake pad.

In some implementations of the disclosure, the TEG module is housed in the intermediate section or entirely within the through-hole.

In some implementations of the disclosure, the backplate has a plurality of through-holes and a plurality of interconnected TEG modules, each TEG module being integrated in a corresponding through-hole.

In some implementations of the disclosure, a braking device includes the above brake pad and an energy management unit connected to the TEG module, the energy management unit having a control logic, a supply electric circuit to a load, and an energy accumulator connected to the supply electrical circuit.

In some implementations of the disclosure, the supply electric circuit includes a plurality of switches switching between a charge status and a discharge status. The energy accumulator can include a plurality of capacitors or super-capacitors. When the switches are in the charge state, the switches are connected in parallel. When the switches are in the discharge state, the switches are connected in series with the capacitors.

BRIEF DESCRIPTION OF THE DRAWINGS

Further characteristics and advantages of the present disclosure will become clear from the following description of exemplary embodiments and with reference to the drawings attached, in which:

FIG. 6 is a plan view of the brake pad according to a second embodiment of the disclosure;

FIG. 7 shows a section of the brake pad taken along lines A-A of FIG. 6;

FIG. 8 shows an enlarged detail of FIG. 7;

FIG. 12a shows a possible parallel connection of TEG modules of the present disclosure;

FIG. 12b shows a possible series connection of TEG modules of the present disclosure;

FIG. 13a shows the energy managing unit of a braking device including a brake pad according to the present disclosure;

FIG. 13b shows an embodiment of the energy accumulator of the energy managing unit of FIG. 13a;

DETAILED DESCRIPTION

Figure 1:
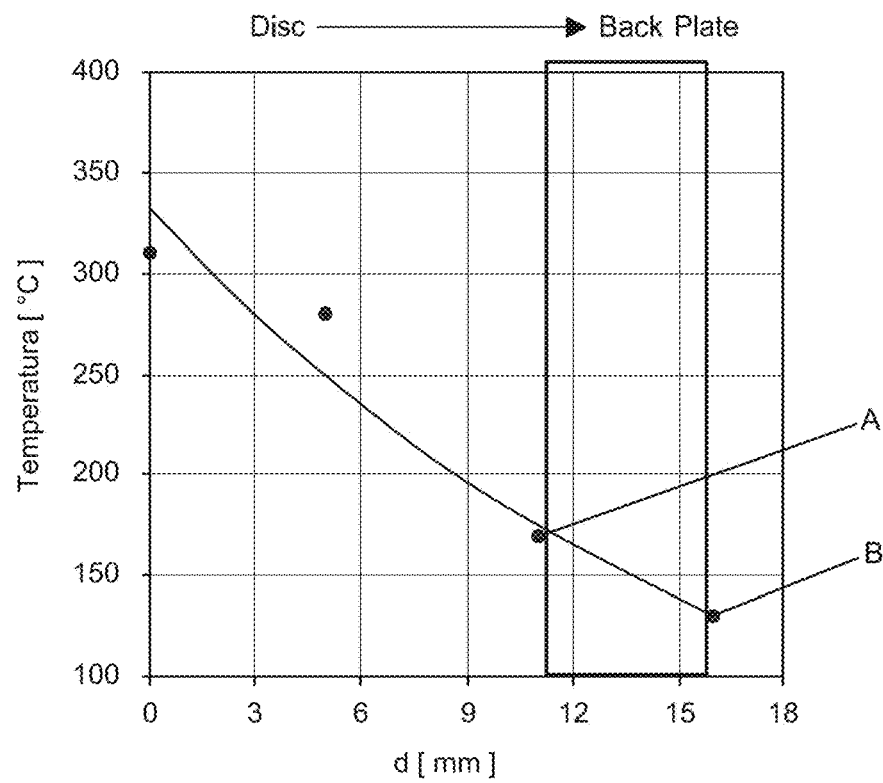
FIG. 1 shows a typical temperature profile in a brake pad after or during braking application.
Figure 2:
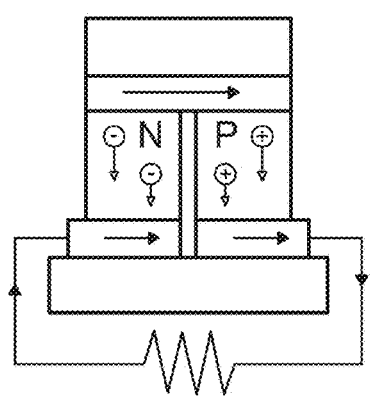
FIG. 2 shows an internal layout of an exemplary TEG module.
Figure 3A:
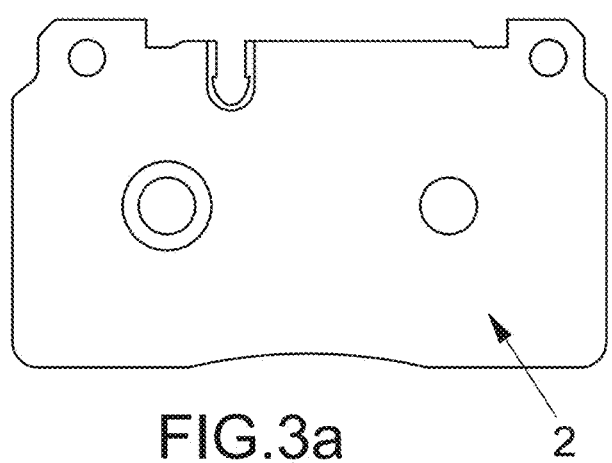
FIG. 3a shows a plan view of a backplate with spigot holes.
Figure 3B:
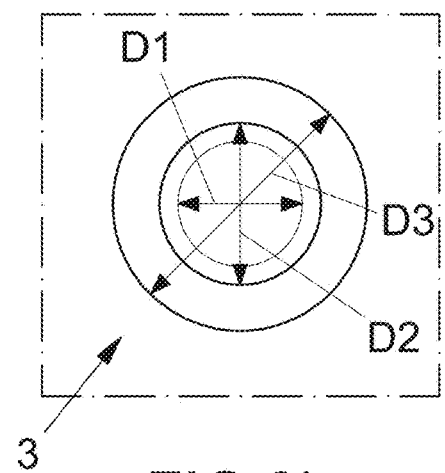
FIG. 3b shows a plan view of a detail of a backplate with a spigot hole processed to be adapted to integrate a TEG module according to the present disclosure.

With reference to the above figures, equivalent parts in different embodiments of the disclosure will be labelled with the same reference number.

Overview

The brake pad 1 comprises a backplate 2, a friction pad 4 made of a friction material attached with the backplate 2, and one or more TEG modules 6. The TEG modules 6 can each comprise n and p-doped semiconductor elements. The brake pad 1 can be equipped with an underlayer 8 interposed between the friction pad 4 and the backplate 2.

The backplate 2 has an internal surface 2a and an external surface 2b. In some embodiments the internal surface 2a and/or the external surface 2b are flat and/or generally parallel to each other. The friction pad 4 can attach to the internal surface 2a of the backplate 2 (such as if there is an underlayer 8).

The friction pad 4 can have the external surface 4a and an internal surface 4b. The external and internal surfaces 4a, 4b can be generally parallel to each other and/or flat. The internal and/or external surfaces 2a, 2b of the backplate can be generally parallel with the internal and/or external surfaces 4a, 4b of the friction pad 4.

The underlayer 8 can have a first surface 8a and a second surface 8b. The underlayer 8 can include adhesives, thermal insulation, or dampening material, etc. These first and second surfaces 8a, 8b of the underlayer can be flat and/or generally parallel to the internal surface of the backplate 2a. The first surface 8a of the underlayer 8 mates with the internal surface 4b of the friction pad 4. The second surface 8b of the underlayer 8 mates with the internal surface 2a of the backplate 2.

The backplate 2 can be made of a metal, such as steel. The backplate 2 can include one or more through-holes 3. The through-holes can also be a spigot-holes, in some implementations. The spigot holes can be used, variously, to secure the backplate in place such as during the manufacture of the brake pad 1 (e.g., assembly with the friction pad 4).

Advantageously, a TEG module 6 can be integrated within a corresponding through-hole 3 of the backplate 2. In some implementations, at least n and p-doped semiconductor elements of the TEG module 6 are integrated within the hole 3. In some implementations, the TEG module can be entirely disposed within the through-hole 3 such that the TEG module is retained entirely within the backplate 2. In certain implementations, the TEG module is only partially disposed within the through-hole 3 (e.g., portions of the TEG extend out one or both ends of the through hole 3.)

Each through-hole 3 can have a first end 3a opening on the internal surface 2a of the backplate 2. A second end 3b of the through hole 3 can open on an external surface 2b of the backplate 2.

In some embodiments, the through-hole 3 comprises multiple different cross sectional shapes. For example, the through hole 3 can include a first end section 3' proximate to the first end 3a of the through-hole 3. The first end section 3' can be cylindrical and have a first diameter D1. The through hole 3 can have an intermediate section 3". The intermediate section 3" can be cylindrical and have a second diameter D2 that is larger than the first diameter D1. The through hole 3 can have a second end section 3'''. The second end section 3''' can be proximate the second end 3b of the through-hole 3. The second end section 3''' can be cylindrical and have a third diameter D3 that is larger than the second diameter D2. The TEG module 6 can be sized to rest within the intermediate section 3". In some embodiments, existing spigot holes can be suitably adapted to integrate the TEG module 6, such as by cutting out the above first, second, and/or third diameters, D1, D2, D3.

In some embodiments, the TEG module 6 is in form of a flat disc or coin (or alternatively any other suitable shape) having a first surface 6a and a second surface 6b. The first surface can face towards the internal surface 2a of the backplate 2. The second surface 6b can face towards the external surface 2b of the backplate 2. In some embodiments, the first surface 6a can rest on a lip 31 created between the first end section 3' and the intermediate section 3".

In some embodiments, the first surface 6a of the TEG module 6 is generally parallel to the internal surface 2a of the backplate 2 and/or the second surface 2b of the TEG module 6 is generally parallel to the external surface 2b of the backplate 2. In some embodiments, the first surface 6a of the TEG module 6 and/or second surface 6b of TEG module 6 are located inside the through-hole 3 and can be offset therefrom.

In some embodiments a first heat exchanger 5 is positioned in thermal contact with the first surface 6a of the TEG module 6. For example, the first heat exchanger 5 can directly contact the first surface 6a or contact the first surface 6a through an intermediate layer (e.g., a thermal conductive paste) such that heat can be conducted between the TEG module 6 and the first heat exchanger 5. Similarly, a second heat exchanger 7 can be positioned in thermal contact on the second surface 6b of the TEG module 6.

The first heat exchanger 5 can be disposed within a channel 9 through the underlayer 8 (if present). The channel 9 can extend through the entire thickness of the underlayer 8 to provide an access path from the friction pad 4 to the backplate 2.

First Embodiment

Figure 4A:
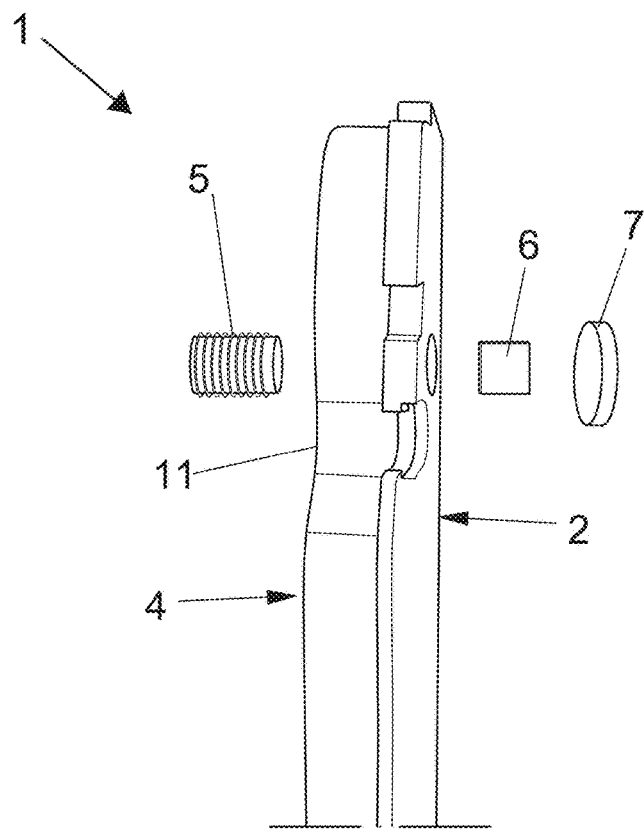
FIG. 4a shows an exploded view of a brake pad according to a first embodiment of the disclosure.
Figure 4B:
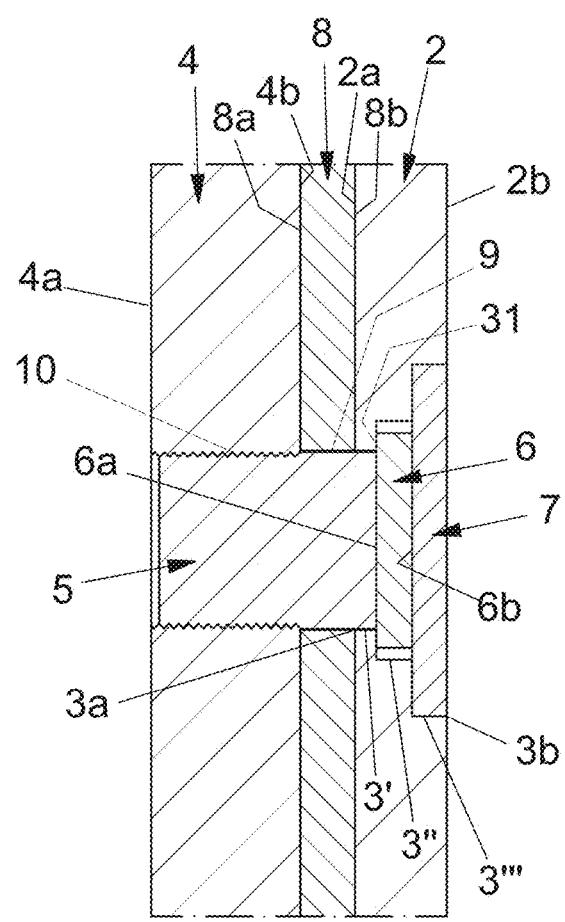
FIG. 4b shows a sectional view of an enlarged detail of the brake pad of the first embodiment.

In the first embodiment illustrated in FIGS. 4a and 4b, the first heat exchanger 5 may further be disposed within a channel 10 of the friction pad 4. Channel 10 can extend through at least one portion or the entire thickness of the friction pad 4. The first heat exchanger 5 can be substantially flush with the main outer surface 4a of the friction pad 4. In certain embodiments, the channel 10 extends only partially through the friction pad 4 from the side of the backplate 2.

In some embodiments, the first heat exchanger 5 and/or the second heat exchanger 7 are cylindrical in shape. In some embodiments, the channels 9 and/or 10 are cylindrical in shape and comprise interior cylindrical walls within the underlayer and friction pad, respectively. In some embodiments, an inner end of first heat exchanger 5 can be disposed within the first end section 3' of the through-hole 3. The diameter of the channels 9 and 10 can be equivalent to the diameter D1. In certain embodiments, only a narrow end portion of the first heat exchanger can contact the TEG module through the first end section 3', as described further below in embodiment 2.

An inner end of second heat exchanger 7 can be disposed within the second end section 3''' of the through-hole 3. The second heat exchanger 7 can be in the form of a plate or coin that fits within the second end section 3''' of the through-hole 3. An outer surface of the second heat exchanger 7 can extend towards the second end 3b of the through-hole 3. In some embodiments, the outer surface of the second heat exchanger 7 can be substantially flush with the external surface 2b of the backplate 2. In certain embodiments, outer surface of the second heat exchanger 7 can extend short of or beyond the external surface 2b.

Let us refer back to the typical temperature profile in a brake pad after or during some braking applications as shown in FIG. 1. The profile illustrated in FIG. 1 was created by placing thermal probes into the friction material, rotor, and backplate. In FIG. 1 is shown the thermal profile of the brake pad from the rotor surface (warm side) down to the backplate (cold side). It is seen that the last two measured points A, B are relate to the two sides of the backplate on the friction material side and the opposite. It can be appreciated that the temperature drops approximately 50° C. between the two sides of the backplate, an approximately 25% drop. Theoretically, approximately 25% of the efficiency can be recovered by a careful design in positioning the cold side heat exchanger.

In some embodiments, the disclosed brake pad exploits spigot holes normally present in a backplate of a brake pad. These spigot holes typically play a role during the pressing of the friction material in the manufacturing process. Spigot holes are ideal for TEG module integration into the brake pad since they do not offer any contribution to the adhesion between friction material and backplate. Spigot holes do put in connection, the inner side of the backplate with its external side and provide an ideal location to maximize the temperature gradient across the backplate. Moreover, the use of spigot holes, in some implementations, does not require any mechanical or structural modification of the brake pad to contact interior and external side of the brake pad. In certain embodiments, only minimal modification is necessary, as discussed herein. This has the advantage of so minimizing any pernicious impact on the NVH performance of the brake pad due to mechanical modifications.

Figure 5:
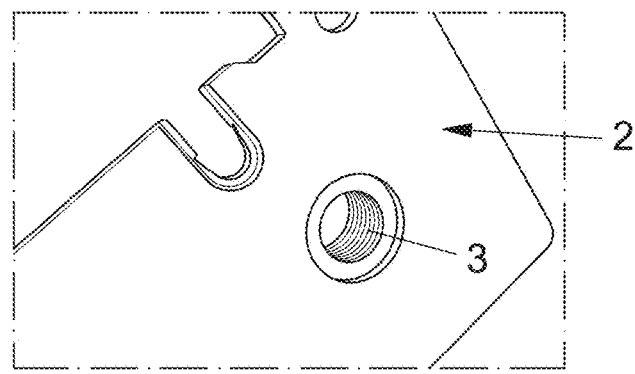
FIG. 5 shows a perspective view of the brake pad of FIG. 4a with the TEG module and heat exchangers removed for clarity.

With further reference to FIGS. 4 and 5, the through hole 3 on the backplate 2 can be made, in some implementations, by modifying an existing spigot hole or other through-hole to integrate the TEG module 6 and the heat exchangers 5, 7. To modify an existing spigot hole, a first recess is milled (or drilled) to create the second end section 3''' of the through-hole 3. The first recess can be axially aligned with the original spigot hole. The second end section 3''' can be about 2 to 3 mm deep. A second recess can be milled in the bottom surface of the first recess to create the cylindrical intermediate section 3''. The second recess can be axially aligned with the first recess. The second recess can be of any depth, such as a depth corresponding to a height of the TEG module. A third recess can be milled to create the first end sections 3'. In certain implementations, the spigot hole itself, with its original diameter can be the first end section 3' without alteration.

Channel 9 can be created within the underlayer 8 and channel 10 can be created through friction pad 4. In some embodiment, the channel 10 can be tapped. In this case, the first heat exchanger 5 includes at least one thread to engage with the threads of the channel 10 of the friction pad 4. The first heat exchanger 5 can be screwed into the friction material. This arrangement can function to support the first heat exchanger 5 against pressure applied to the brake pad. This can inhibit or prevent undue pressure on the underlying TEG module 6 from the use of the brake pad 1 (e.g., pressure from the brakes against the rotor disk).

Figures 10, 11:
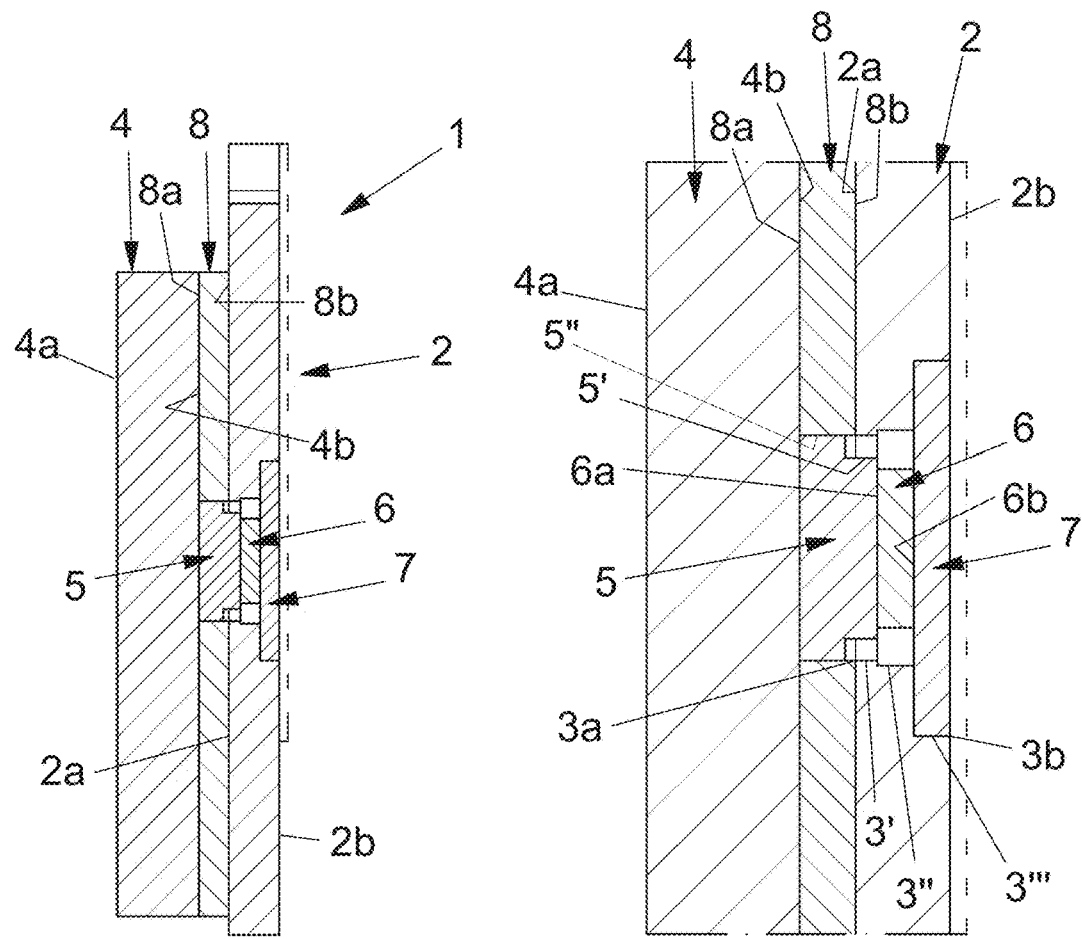
FIG. 10 shows a section of the brake pad taken along lines A-A of FIG. 9.
FIG. 11 shows an enlarged detail of FIG. 10.

In some embodiments, such as those shown in FIGS. 8 and 11, the first heat exchanger 5 has a narrowed cylindrical end portion 5'. This narrowed cylindrical end portion 5' can be inserted into the backplate 2 and contact the TEG module 6. A widened end portion 5'' forming a lip on the first heat exchanger 5 can engage with a corresponding lip 81 on the underlayer 8 or within the friction pad 4. This can inhibit or prevent undue pressure on the surface of the underlying TEG module 6 from the use of the brake pad 1. Alternatively, the lip 81 can be the backplate 2.

In certain embodiments, the first heat exchanger 5 is attached within the channel 10 by gluing to the friction pad (e.g., using structural high temperature resin of the siliconic, bismalleimide, epoxidic, ester cyanides or polyimide families). The selected glue material can fill gaps between the first heat exchanger 5 and the friction material forming the channel 10 and seal against water absorption.

The end face of the first heat exchanger 5 can be flat (or any other shape) to fit with the correspondingly shaped face of the TEG module 6. The TEG module 6 can be composed of at least two opposite p- and n-doped semiconductor materials. Two terminals of the TEG module can be closed by two high temperature cables or other charge carrying conductors that carry generated current generated by the TEG module outside of the TEG module. The two high temperature cables or other charge carrying conductors can extend through an aperture the second heat exchanger 7 or between the base plate 2 and the second heat exchanger 7.

The first surface 6a of the module 6 can be in direct contact with the corresponding flat face of the first heat exchanger 5. A thin layer of high temperature thermal conductive paste can be used to improve the thermal contact between parts 5 and 6. The other surface 6b of the module 6 can be in contact with the corresponding flat face of the second heat exchanger 7.

The second (cold side) heat exchanger 7 being flat can be made of materials with high thermal conductivity, such as but not limited to aluminum or copper, that keeps the cold side of the module 6 close to or at the same temperature of the external side of the backplate 2. In some embodiments, the higher thermal conductivity of such material with respect the steel adopted for standard brake pads can keep the second heat exchanger 7 cooler than the backplate 2.

In the first embodiment, the first heat exchanger 5 (in the form of a threaded metallic pin on the hot side) is positioned into the cylindrical first end section 3' of the through-hole 3. High temperature glues or sealant can be placed into the hole 3 to seal the space between the cylindrical first end section 3' of the through-hole 3 and the screwed metallic pin.

A thermal paste can be positioned upon the metallic flat face of the first heat exchanger 5 and the TEG module 6 can be placed in contact with the first face of the first heat exchanger 5 within the cylindrical intermediate section 3" of the through-hole 3. Cables or interconnecting elements are extended outside of the through-hole 3 onto the surface of the backplate 2 (either around or through some aperture in the second heat exchanger 7).

A thermal paste or sealing thermal glue can be placed on top of the TEG module 6 and the second heat exchanger 7 (in the form of a disk or coin) can be placed in contact with the TEG module. The second heat exchanger 7 can close the through-hole 3 completely. This can perfectly align the backplate 2 with the second heat exchanger's surface to avoid formation of unwanted drag on the caliper on which brake pad 1 mounts.

Once assembled the brake pad 1 is ready to be used on the caliper. By interconnecting the two terminals (e.g., the cables integrated on the brake pad 1) a load can be fed by the TEG module 6 in the brake pad 1 as long as a thermal gradient is present across the brake pad 1.

In some embodiments, the first heat exchanger 5 can made of highly thermal conductive and/or cheap metals (aluminum and copper). Other insulating materials with high thermal conduction (e.g., ceramics, alumina and others) can be used.

Second Embodiment

A second embodiment of the disclosure is shown in FIGS. 6 to 8. In some implementations, a first heat exchanger 5 made of metal is undesirable because of the risk of damage to the brake discs. The brake disk can quickly be irreparably damaged. In certain implementations, such as where coated brake disks are used, the scraping action of the metal heat exchanger on a disk surface is not an issue. For example, the coating can be very hard and/or the pad can wear very little.

In the second embodiment, a soft material with high thermal conductivity can be used to avoid surface damage to the brake discs. A material with such characteristics is graphite. Graphite has in fact a thermal conductivity comparable to those of many metals (usually comprised between $\lambda$50-400 W/mK) and in some cases larger than that of aluminum (approximately $\lambda$180 W/mK).

The large spread of values of thermal conductivity for graphite is due to the fact that in-plane conductivity is much larger than intra-planar conductivity (two orders smaller). As a result the actual thermal conductivity value will be influenced by the purity level and the grain orientation of the microstructure of the graphite materials which compose a typical graphite rod. The thermal conductivity depends on the fraction of the grains oriented along the cylinder axis of the rod with the graphite plane on that direction. A preferred choice is for graphite compounds with conductivity larger than $\lambda$100 W/mK, and preferably larger than $\lambda$200 W/mK, which can be higher than some metals.

In the second embodiment, the first heat exchanger 5 can be made of graphite. This graphite first heat exchanger 5 is modeled in a similar way than the metallic version. In some implementations, one flat face of the first heat exchanger 5 can be aligned with exterior surface 4a of the friction material pad 4 and the other flat face hosting a corresponding flat face 6a of the module 6.

As noted above, to release pressure on module 6, the first heat exchanger 5 can also have the narrowed end portion 5' and a wider portion 5". The narrowed end portion 5' can contact the module 6. The lip formed by the wider portion 5" can engage the corresponding lip on any of the backplate 2 (e.g., around the first end section 3' of the through-hole 3), the underlayer 8, or the friction pad 4. This way any potential impact on the brake pad specifications can be lessened.

TEG module 6 can be integrated on the backplate 2 within the intermediate section 3" in a similar way as done for the previously discussed embodiment. The second heat exchanger 7 on the cold side can be made of any suitable material including graphite or metal.

Using graphite material for first heat exchanger 5 provides the advantages of not interfering with the braking action of the brake pad 1. Graphite will not scrap the disc rotor surface. Graphite is commonly used in the brake pads 4 as a lubrication materials to balance different physical properties of friction pads. The graphite first heat exchanger 5 will wear into a flat surface in contact with the disc rotor, ensuring a good thermal contact with the disc rotor.

Third Embodiment

Figure 9:
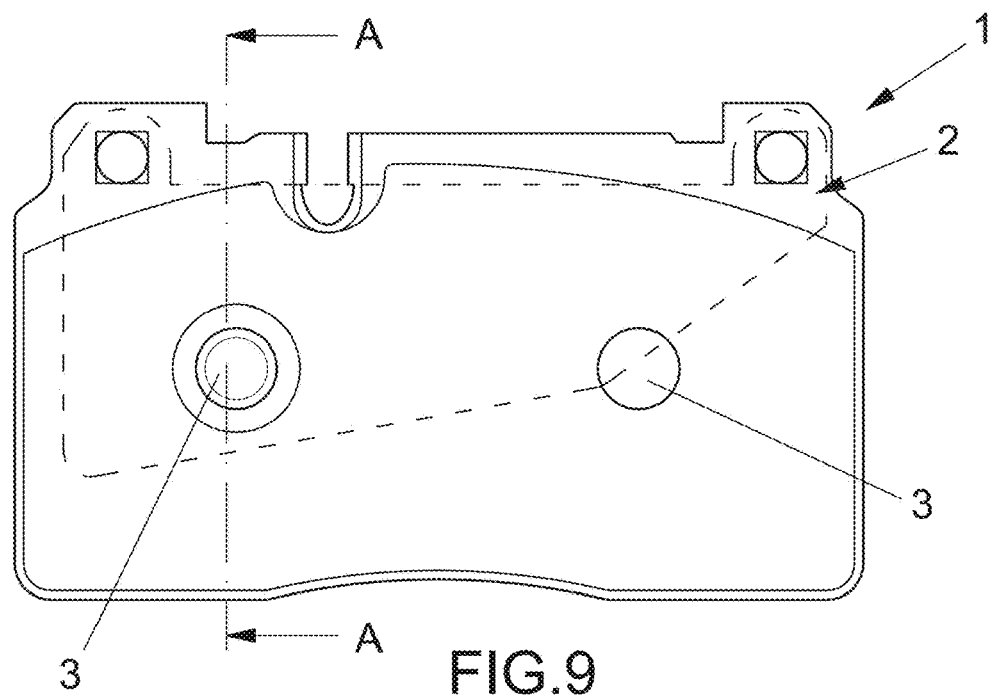
FIG. 9 is a plan view of the brake pad according to a third embodiment of the present disclosure.

A third embodiment is illustrated in FIGS. 9 to 11. In the third embodiment, a short first heat exchanger 5 on the warm side can be used. In particular, instead of extending up to the level of the exterior surface 4a of the friction material 4 to be directly in contact with the brake disc rotor, the first heat exchanger 5 is maintained within the friction pad 4. For example, the first heat exchanger 5 can be limited to the edge of the underlayer 8. In certain implementations, the channel 10 is located at least partially within the friction pad, but not all the way to the exterior surface 4a; the channel 10 can extend through less than half the friction pad in such an embodiment.

The third embodiment is less efficient than the first two because of the smaller thermal gradient across the two sides of the module 6. This embodiment can be beneficial because it requires little or no invasive manufacture/modification of the brake pad 1. The third embodiment can also have a lower cost due to the smaller quantities of materials employed. This embodiment can be used for, but is not limited to, applications in friction brakes or friction based applications (Brake Drums, Clutches etc.) where the amount of produced energy is not the main goal, (e.g., low power applications, sensors, wireless sensors application). The material employed for the heat exchangers 5, 7 will be driven by cost and efficiencies issues.

The two heat exchangers 5, 7 in the third embodiment can be made of metal or graphite indifferently since the two heat exchangers 5, 7 will be beneath the friction material of the friction pad 4. In some implementations, a face of the first heat exchanger 5 is substantially in line with the second surface 8a of the underlayer 8 to optimize the thermal gradient.

In all the embodiments disclosed herein, multiple similar structures can be realized on the same brake pad 1. This can be done for example by simply exploiting all the present spigot holes in the brake pad, which normally includes 2 or 3 in a standard brake pad. In addition or in lieu of the existing spigot holes, one or more through-holes 3 can be made in the backplate 2 to host more modules 6 within the brake pad 1.

Certain Electrical Connections

The multiple modules 6 can be interconnected in series and/or parallel interconnections. The decision series or parallel can depend, for example, on whether the voltage outputs or the electrical currents are to be the focus, or both (see FIGS. 12a and 12b).

Advantageously an energy management unit 12 can be connected to the one or more TEG modules 6. The energy management unit 12 can include logic controller 17, which can be ultra-low-power, a supply electric circuit 13 to a load 14, and/or an energy accumulator 15 connected to the supply electrical circuit 13.

The supply electric circuit 13 comprises a plurality of switches 16 switching between a charge status and a discharge status. The energy accumulator 15 comprises a plurality of capacitors 15'. In the charge status, the switches 16 connect in parallel with the capacitors 15'. In the discharge status, switches 16 connect in series with the capacitors 15'.

The energy management unit 12 can be used to maximize the energy recovered from the TEG modules and can be used to supply the power generated to feed the specific application powered with this unit. The energy management unit 12 can be important, for example in a braking system, in which usage is unpredictable and/or random in general. Therefore, the usability of a TEG modules 6 integrated into the pad can benefit from integration with the energy management unit 12.

With reference to FIGS. 13a, 13b, 14a, 14b the output from the TEG module 6 can be managed by a voltage regulator 18. The voltage regulate 18 can be used to get approximately the same voltage used load the energy accumulator 15. The logic controller 17 manages and controls the switches 16 from the charge status of the capacitors 15' to the discharge status based on when the load 14 conditions require high quantities of current. The logic controller 17 operates, in some embodiments, on the voltage regulator 18, which is used as a smart switch for opening and closing the branch of the circuit 13 connected with the external load 14.

Figure 14A:
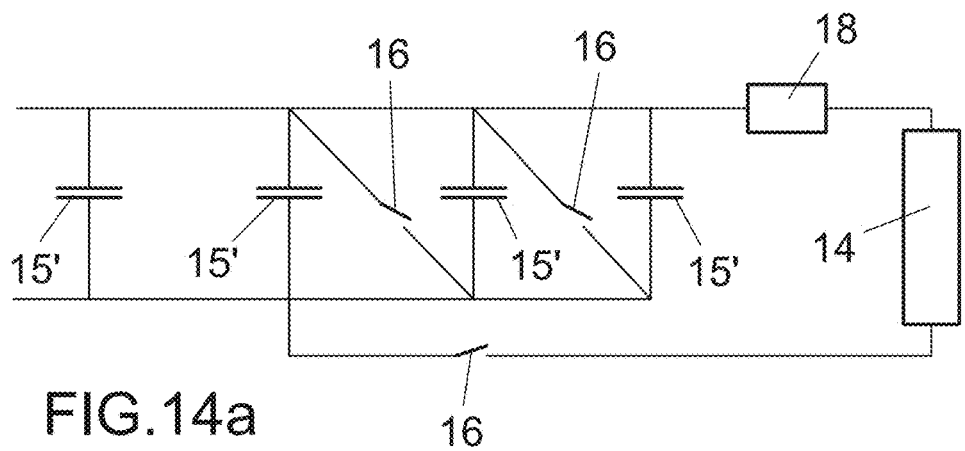
FIG. 14a shows the supply circuit in the charging status.

In FIG. 14a, all the switches 16 are closed corresponding to the charge state, except the switches on the diagonal. This means that all the capacitors 15' are charging based on the module 6 and they will charge at the same voltage emitted from the voltage regulator 18. This condition will happen whenever no load is present on the circuit 13 or where the load 14 does not require any current from the module 6.

Figure 14B:
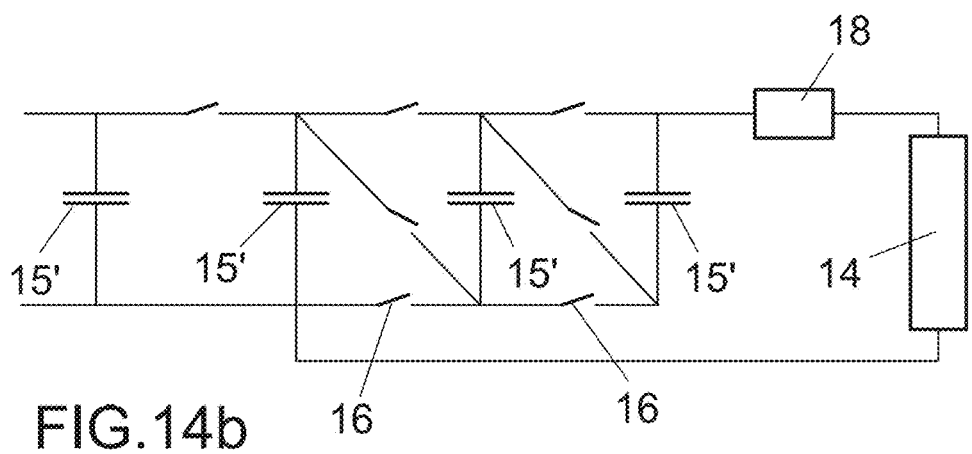
FIG. 14b shows the supply circuit in the discharging status.

In FIG. 14b, the logic controller 17 opens all the switches 16 to the discharge state, with the exception of those on the diagonal. As a result the first capacitor 15' is sectioned from the rest of the circuit and it is still fed by the module 6 to keep charging during this phase. The remaining capacitors 15' are now in series and can feed an external circuit with higher voltage.

This configuration can allow the use of a simplified module 6 with lower operating voltage (so cheaper) and capable of generating current even in mild operating condition (small thermal gradients). While in a discharging state the same simplified module 6 can power standard electronic systems (at higher voltages) without any special requirements. For example, standard components can be used that are compatibility with automotive standards.

EXAMPLES

Figure 15A:
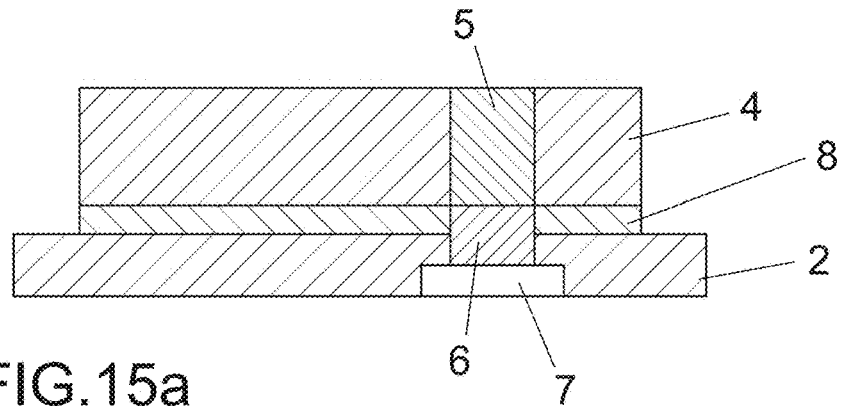
FIG. 15a shows schemes of brake pads of a prototype A used for testing.
Figure 15B:
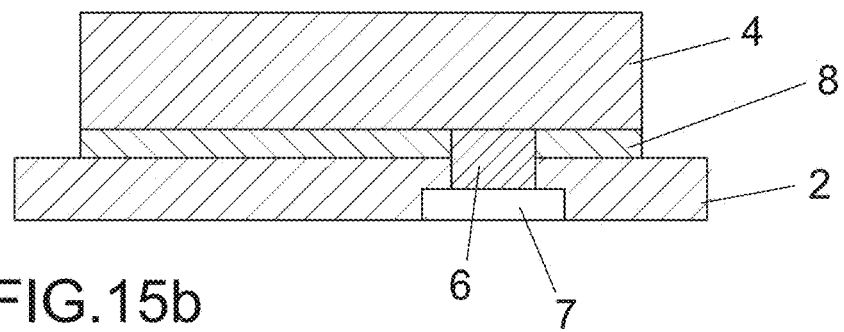
FIG. 15b shows schemes of brake pads of a prototype B used for testing.

FIGS. 15a, 15b, 16 and 17 show the result of testing sessions on two different energy harvesting prototypes. Prototype A, shown in FIG. 15a, is similar to the second embodiment discussed above where the first heat exchanger 5 is made of graphite and the second heat exchanger 7 is made of aluminum. Prototype B, shown in FIG. 15b, is similar to the third embodiment, but includes only a TEG module 6 and no first heat exchanger 5.

Both graphite ($\lambda$ 50-400 W/mK) and aluminum ($\lambda$ 180 W/mK) are good thermal conductors that facilitate a good thermal transport through the pad. Concerning prototype A, the presence of graphite on the friction material surface doesn't produce damages on the disc due the graphite tendency to exfoliate itself.

The test consists in brake applications at mild pressure (up to 10 bars) with the aim to establish a thermal gradient between the friction material side and the backplate side. The disc temperature is assumed to be equal to the temperature of the friction material temperature on the hot side and was acquired with a pyrometer. The backplate temperature on the cold side was acquired with a K-type thermocouple. The voltage from the TEG module was also measured in order to estimate the efficiency of the system in terms of power end energy generated during the brake application.

Figure 16:
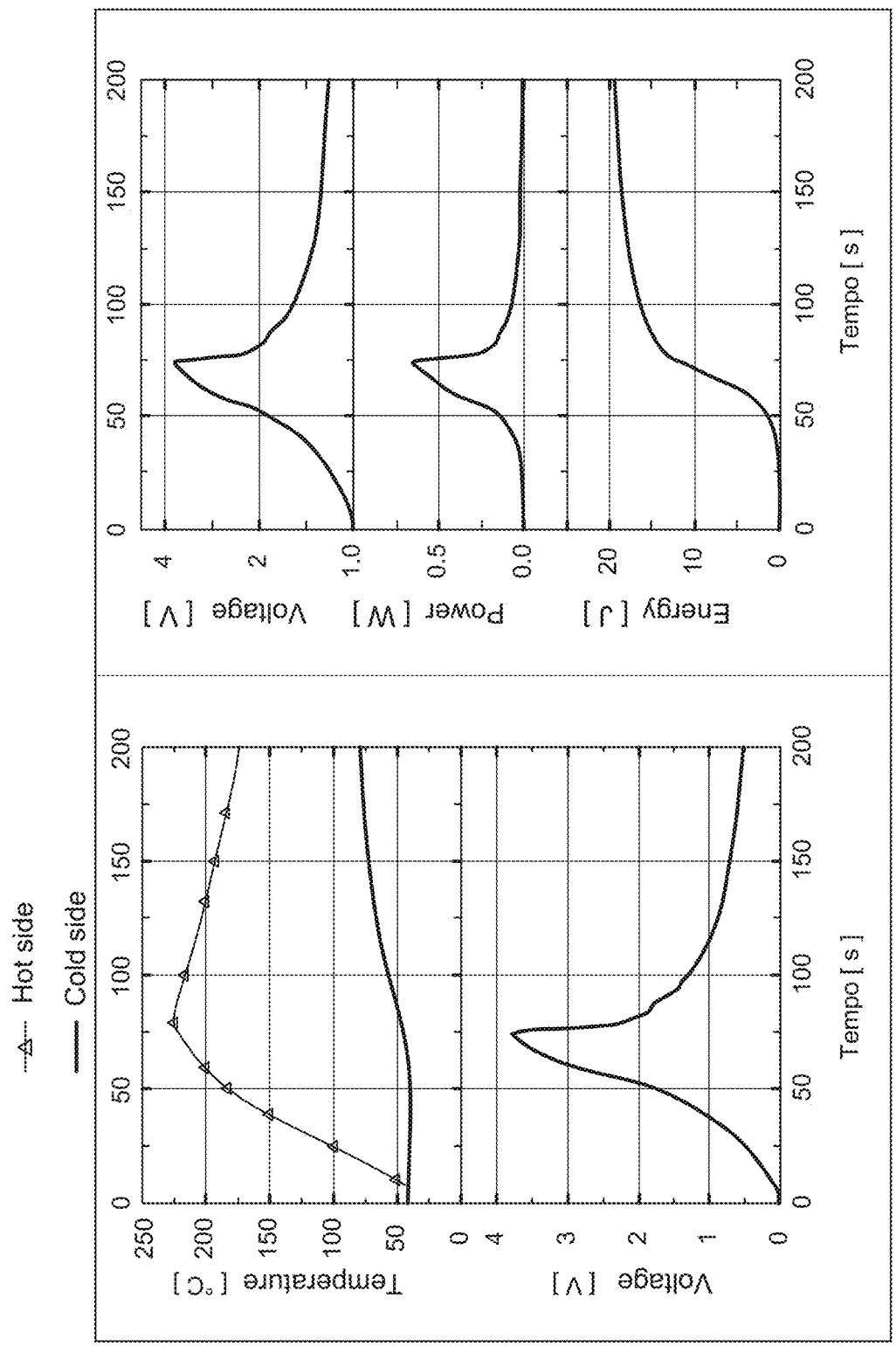
FIG. 16 shows acquired data from the prototype A.

Prototype A is the most efficient of tested prototypes in terms of power generation. As shown in FIG. 16, for a maximum thermal gradient of 170° C., the TEG module produces a maximum voltage of 3.8V. When the disc temperature exceeds the set point (200° C.) the system is cooled. This period allows one to see the cooling dynamics of the TEG module. After the pressure is off the brake pads, it is possible estimate the loss of voltage during the cool down time. In the first 50 seconds the voltage loss over time is dV/dt 50 mV/s after the transient the system thermalized and dV/dt became approximately zero with a voltage output of 500 mV.

The FIG. 16 at right side shows the comparison between voltage, power and energy generated during the brake application. The power reaches the peak value 700 mW and the energy generated during the brake application is near 20 J.

The TEG module can operate as voltage generator. In order to estimate the total power generated during the brake application a load was placed on the circuit between the two poles of the TEG module.

Figure 17:
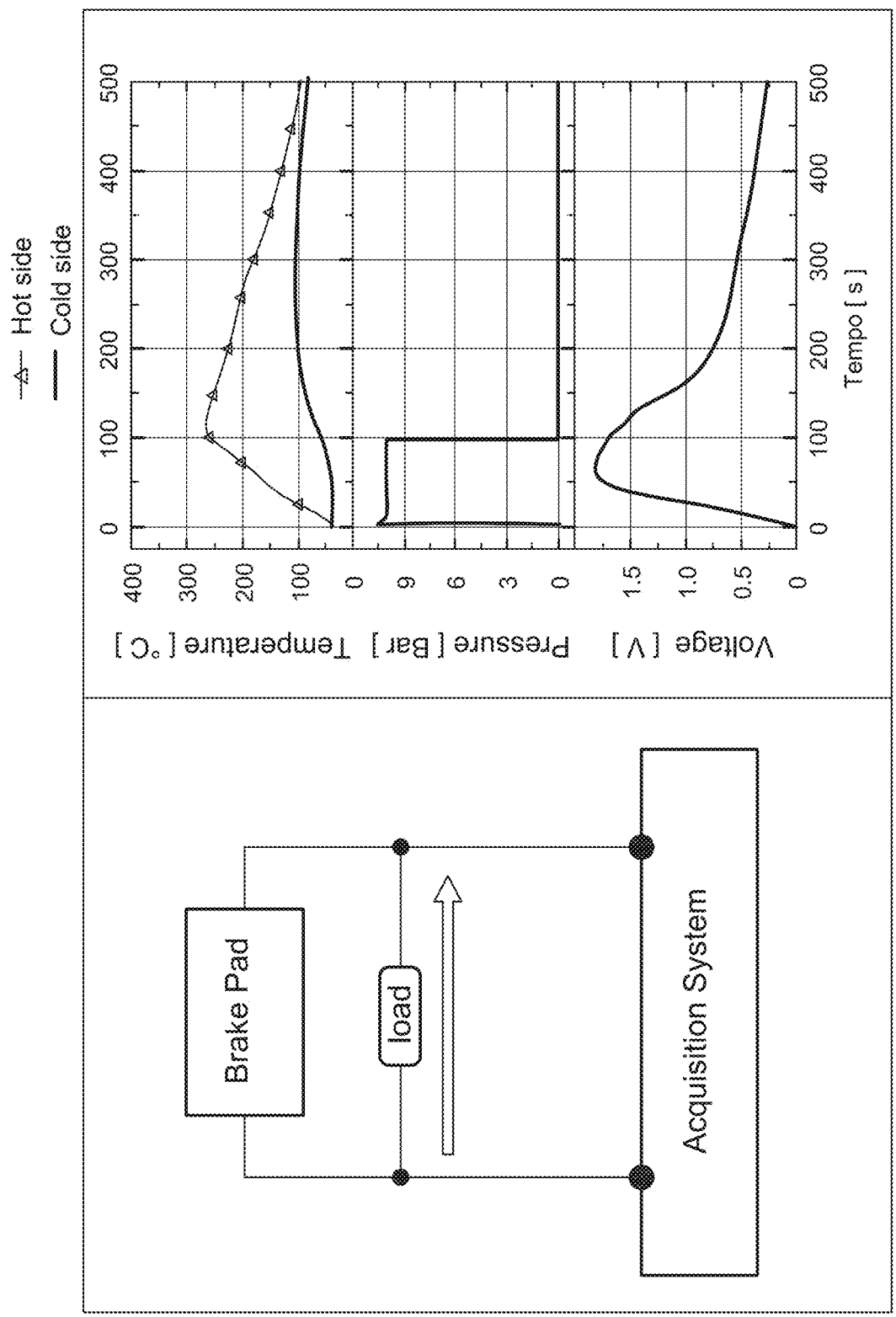
FIG. 17 shows acquired data from the prototype A under load.

When performing the same test with the presence of a resistive load, as shown in FIG. 17, it was observed that output voltage decreased from 3.5 to 1.8 V. The smaller voltage level reached is associated with an internal power losses with respect the open circuit condition without load. The power will drop correspondently for a single module. Nevertheless this is a remarkable power for such a small TEG module (<1 cm$^2$).

Prototype B is less efficient than prototype A, but performed well nevertheless. The advantage of the prototype B is that the TEG module is embedded inside the underlayer which has a protective function. Both systems, once coupled to an energy management system, can feed electronic systems for a time that will be determined by the amount of energy harvested.

Certain Terminology

Although certain brake pads with thermoelectric energy harvesters have been disclosed in the context of certain example embodiments, it will be understood by those skilled in the art that the scope of this disclosure extends beyond the specifically disclosed embodiments to other alternative embodiments and/or uses of the embodiments and certain modifications and equivalents thereof. Use with any structure is expressly within the scope of this invention. Various features and aspects of the disclosed embodiments can be combined with or substituted for one another in order to form varying modes of the assembly. The scope of this disclosure should not be limited by the particular disclosed embodiments described herein.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Terms of orientation used herein, such as "top," "bottom," "proximal," "distal," "longitudinal," "lateral," and "end" are used in the context of the illustrated embodiment. However, the present disclosure should not be limited to the illustrated orientation. Indeed, other orientations are possible and are within the scope of this disclosure. Terms relating to circular shapes as used herein, such as diameter or radius, should be understood not to require perfect circular structures, but rather should be applied to any suitable structure with a cross-sectional region that can be measured from side-to-side. Terms relating to shapes generally, such as "circular" or "cylindrical" or "semi-circular" or "semi-cylindrical" or any related or similar terms, are not required to conform strictly to the mathematical definitions of circles or cylinders or other structures, but can encompass structures that are reasonably close approximations.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language, such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

The terms "approximately," "about," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic. As an example, in certain embodiments, as the context may dictate, the term "generally parallel" can refer to something that departs from exactly parallel by less than or equal to 20 degrees.

Some embodiments have been described in connection with the accompanying drawings. The figures are to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

SUMMARY

Various illustrative embodiments of brake pads with thermoelectric energy harvesters have been disclosed. Although these brake pads have been disclosed in the context of those embodiments, this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Accordingly, the scope of this disclosure should not be limited by the particular disclosed embodiments described above, but should be determined only by a fair reading of the claims that follow as well as their full scope of equivalents.

What is claimed is:

1. A brake pad, comprising:
   a backplate;
   a friction pad made of a friction material and supported by the backplate, an exterior surface of the friction pad facing away from the backplate and an interior surface of the friction pad facing the backplate;
   an underlayer between the backplate and the friction pad, wherein a passageway extends through the backplate and the underlayer;
   a thermoelectric generator (TEG) module comprising p-doped and n-doped semiconductor elements;
   a first heat exchanger positioned in the passageway and in thermal contact with a first surface of the TEG module and with the interior surface of the friction pad; and
   a second heat exchanger in the passageway and in thermal contact with a second surface of the TEG module, the second surface being opposite the first surface, the TEG module positioned between the first heat exchanger and the second heat exchanger in an axial direction of the passageway.

2. The brake pad according to claim 1, wherein the passageway comprises a channel in the backplate and the TEG module is entirely positioned within the channel.

3. The brake pad according to claim 2, wherein:
   the channel comprises a cylindrical first end section having a first diameter, a cylindrical intermediate section having a second diameter, and a cylindrical second end section having a third diameter; and
   the third diameter is greater than the second diameter, and the second diameter is greater than the first diameter.

4. The brake pad according to claim 3, wherein the TEG module is disposed within the cylindrical intermediate section.

5. The brake pad according to claim 3, wherein the channel comprises a spigot hole.

6. The brake pad according to claim 1, wherein the passageway comprises a channel formed in the friction material of the friction pad, and the first heat exchanger is disposed within the channel.

7. The brake pad according to claim 6, wherein the channel formed in the friction material does not extend to an external surface of the friction pad.

8. The brake pad according to claim 7, wherein the first heat exchanger is fixed to an interior wall of the friction material.

9. The brake pad according to claim 8, wherein the first heat exchanger is adhesively fixed to the interior wall of the friction material.

10. The brake pad according to claim 1, wherein the TEG module and the brake pad are arranged with respect to one another such that the friction material of the brake pad relieves pressure on the TEG module from braking action of the brake pad.

11. The brake pad according to claim 1, wherein the underlayer comprises a dampening material.

12. The brake pad according to claim 1, wherein the first heat exchanger comprises graphite.

13. The brake pad according to claim 12, wherein the second heat exchanger comprises graphite.

14. The brake pad according to claim 1, wherein a face of the first heat exchanger is substantially in line with a surface of the underlayer.

15. The brake pad according to claim 1, further comprising an energy management unit connected to the TEG module, the energy management unit comprising:
　a logic control;
　a supply electric circuit coupled with a load, the supply electric circuit comprising a plurality of switches switching between a charge state and a discharge state; and
　an energy accumulator connected to the supply electrical circuit, the energy accumulator comprising a plurality of capacitors;
　wherein in the charge state the switches connect in parallel with the capacitors and in the discharge state the switches connect in series with the capacitors.

16. A method of modifying an existing brake pad to include a TEG module, comprising:
　obtaining a brake pad, the brake pad comprising a backplate with a spigot hole, a friction pad including friction material, and an underlayer between the backplate and the friction pad;
　forming a first cylindrical end section having a first diameter within the backplate, wherein the first cylindrical end section comprises an original diameter of the spigot hole;
　forming an intermediate cylindrical section having a second diameter within the backplate, the second diameter being greater than the first diameter, the intermediate cylindrical section being axially aligned with the spigot hole;
　forming a second cylindrical end section having a third diameter within the backplate, the third diameter being greater than the second diameter, the second cylindrical end section being axially aligned with the spigot hole;
　wherein a passageway in the brake pad comprises the first cylindrical section, the intermediate cylindrical section, and the second cylindrical section;
　inserting a first heat exchanger within the passageway;
　inserting the TEG module within the passageway; and
　inserting a second heat exchanger within the passageway, the first and second heat exchangers thermally contacting the TEG module, and
　wherein the TEG module is positioned between the first heat exchanger and the second heat exchanger in an axial direction of the passageway.

17. The method according to claim 16, further comprising forming a channel within the friction material of the friction pad, the channel axially aligned with the spigot hole, wherein the channel does not extend to an external surface of the friction pad.

18. The method according to claim 17, further comprising fixing the first heat exchanger to the friction material surrounding the channel.

19. The brake pad according to claim 16, wherein the second heat exchanger is positioned within the second cylindrical section.

20. The brake pad according to claim 17, wherein the second heat exchanger is configured to close the channel.

* * * * *